United States Patent
Chi et al.

(10) Patent No.: US 8,039,316 B2
(45) Date of Patent: Oct. 18, 2011

(54) INTEGRATED CIRCUIT PACKAGING SYSTEM WITH STACKED INTEGRATED CIRCUIT AND HEAT SPREADER WITH OPENINGS AND METHOD OF MANUFACTURE THEREOF

(75) Inventors: HeeJo Chi, Daejeon-si (KR); Soo Jung Park, Seoul (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 284 days.

(21) Appl. No.: 12/423,099

(22) Filed: Apr. 14, 2009

(65) Prior Publication Data

US 2010/0258928 A1  Oct. 14, 2010

(51) Int. Cl.
*H01L 21/44* (2006.01)
*H01L 23/28* (2006.01)

(52) U.S. Cl. ........ 438/122; 438/106; 257/678; 257/706; 257/717; 257/720; 257/796; 257/E23.001; 257/21.499

(58) Field of Classification Search .................. 438/106, 438/122; 257/678, 706, 717, 720, 796, E23.001, 257/E21.499
See application file for complete search history.

(56) References Cited

U.S. PATENT DOCUMENTS

| | | |
|---|---|---|
| 6,627,990 B1 | 9/2003 | Shim et al. |
| 6,700,783 B1 | 3/2004 | Liu et al. |
| 6,737,750 B1 | 5/2004 | Hoffman et al. |
| 6,760,224 B2 | 7/2004 | Moden et al. |
| 6,919,631 B1 | 7/2005 | Hoffman et al. |
| 7,126,218 B1 | 10/2006 | Darveaux et al. |
| 7,205,651 B2 | 4/2007 | Do et al. |
| 7,317,247 B2 | 1/2008 | Lee et al. |
| 7,768,107 B2 * | 8/2010 | Bauer et al. .................. 257/678 |
| 2002/0056909 A1* | 5/2002 | Kwon et al. .................. 257/720 |
| 2005/0116335 A1* | 6/2005 | Karim ........................... 257/718 |
| 2006/0216858 A1* | 9/2006 | Cherukuri et al. ............ 438/106 |
| 2008/0012095 A1 | 1/2008 | Lee et al. |

* cited by examiner

*Primary Examiner* — Thanh V Pham
(74) *Attorney, Agent, or Firm* — Mikio Ishimaru

(57) ABSTRACT

A method of manufacture an integrated circuit packaging system includes: providing a substrate; attaching a first integrated circuit to the substrate by interconnects only along opposite sides of the first integrated circuit; and attaching a heat spreader to the substrate, the heat spreader extending over the first integrated circuit and between the opposite sides of the first integrated circuit.

20 Claims, 6 Drawing Sheets ized, to increase the density of the components that are packaged therein while decreasing the sizes of the products that are made therefrom. This is in response to continually increasing demands on information and communication products for ever-reduced sizes, thicknesses, and costs, along with ever-increasing performance.
INTEGRATED CIRCUIT PACKAGING SYSTEM WITH STACKED INTEGRATED CIRCUIT AND HEAT SPREADER WITH OPENINGS AND METHOD OF MANUFACTURE THEREOF

TECHNICAL FIELD

The present invention relates generally to an integrated circuit packaging system, and more particularly to a system for an integrated circuit packaging system with a stack integrated circuit.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

As the integrated circuit technology advances, more circuit cells can be fabricated in a similar die area so that substantially increased functionality can be accomplished on a given integrated circuit die. The added functionality and increase in the number of circuits generally involves a larger amount of power dissipation. The heat is transmitted from one integrated circuit to the other and there is no significant dissipation path other than through the solder ball to the motherboard. The increased heat in the package can significantly reduce the life of the integrated circuits in the package.

Thus, a need still remains for an integrated circuit packaging system providing low cost manufacturing and improved reliability. In view of the ever-increasing need to save costs and improve efficiencies, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching a first integrated circuit to the substrate by interconnects only along opposite sides of the first integrated circuit; and attaching a heat spreader to the substrate, the heat spreader extending over the first integrated circuit and between the opposite sides of the first integrated circuit.

The present invention provides an integrated circuit packaging system, including: a substrate; a first integrated circuit attached to the substrate by interconnects only along opposite sides of the first integrated circuit; and a heat spreader attached to the substrate, the heat spreader extending over the first integrated circuit and between the opposite sides of the first integrated circuit.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
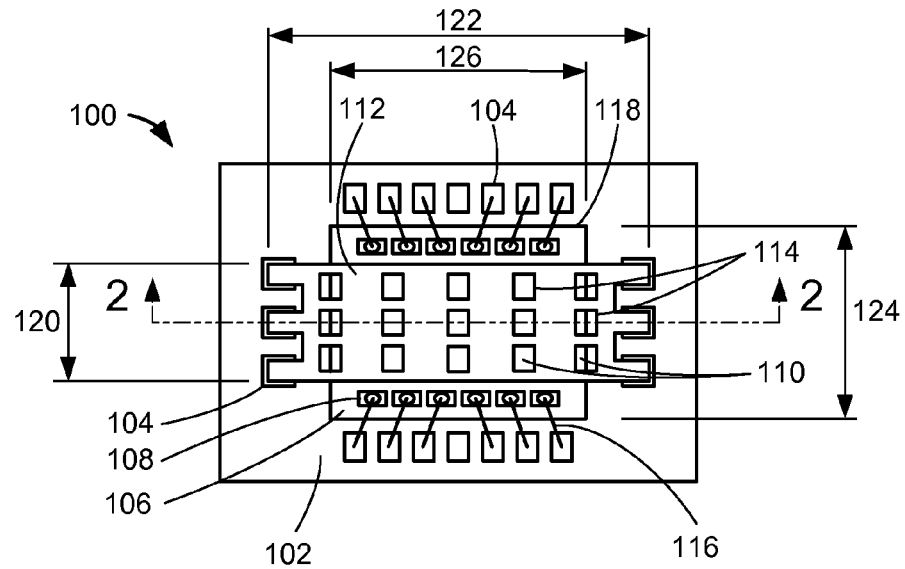
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view is shown without a top portion of an encapsulant, such as a cover including epoxy molding compound. The top view depicts a substrate 102, such as an organic or inorganic substrate, which may include interconnect pads 104, such as bonding pads.

The integrated circuit packaging system 100 may include a second integrated circuit 106, such as an integrated circuit die, which may include top interconnect contacts 108, such as bonding pads. The second integrated circuit 106 may have a length 126 longer than a width 124. An interface layer 110, such as a dielectric, a cut and place film, a thermal adhesive, or a thermally conductive gel, may be over the second integrated circuit 106.

An additional heat spreader 112, such as solid or perforated, may be over the interface layer 110. The additional heat spreader 112 may include openings 114. The integrated circuit packaging system 100 may include perforating the additional heat spreader 112 with a regular pattern of the openings 114.

The additional heat spreader 112 may have a length 122 longer than a width 120. The width 120 of the additional heat spreader 112 may be smaller than the width 124 of the second integrated circuit 106. The additional heat spreader 112 may extend over the second integrated circuit 106 and between the opposite sides 118 of the second integrated circuit 106.

The top view of the integrated circuit packaging system 100 is shown with a portion of the substrate 102 and a portion of the interface layer 110 visible through the openings 114 of the additional heat spreader 112.

It has been discovered that the additional heat spreader 112 with the length 122 longer than the width 120 will fit well over the second integrated circuit 106 having a length 126 longer than a width 124 while allowing side wire bonding of the second integrated circuit 106 and exceptional heat dissipation from the second integrated circuit 106.

This discovery is a result of devices that use Flash memory chips getting smaller. In the smaller devices, smaller Flash memory packages are required that have the length longer than the width to fit into Flash memory sticks. At the same time with the shrinking chips, memory density is increasing, which results in greater heat generation and the need to better dissipate heat from the chips.

It has also been discovered that by adjusting the number and size of the openings 114 in the additional heat spreader 112 that it is possible to adjust the coefficient of thermal expansion (CTE) of the additional heat spreader 112. This permits the CTEs to be matched of the additional heat spreader 112 and of the components, such as the second integrated circuit 106 and the substrate 102. This in turn reduces stresses throughout the Flash memory package.

The integrated circuit packaging system 100 may include interconnects 116, such as bond wires, which may connect the interconnect pads 104 and the top interconnect contacts 108. The interconnects 116 may connect only along opposite sides 118 of the second integrated circuit 106.

Figure 2:
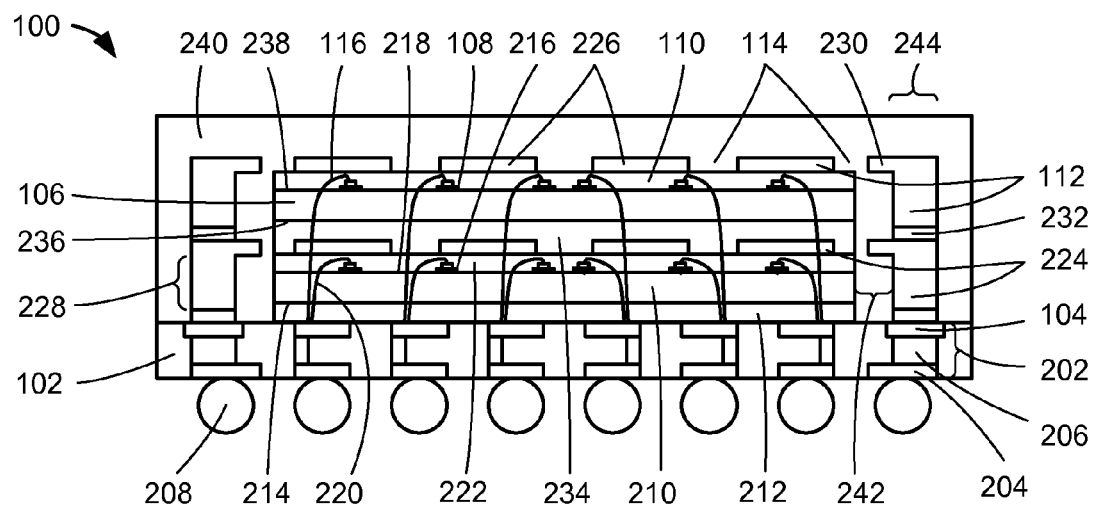
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The cross-sectional view depicts the substrate 102 having through thermal channels 202, each of which may include the interconnect pad 104 over an external interconnect pad 204 with a wide electrical via 206 connecting the interconnect pad 104 and the external interconnect pad 204. The through thermal channels 202 may be over external interconnects 208, such as solder balls.

A first integrated circuit 210, such as an integrated circuit die, may be mounted over the substrate 102. The first integrated circuit 210 may have the length 126 of FIG. 1 longer than the width 124 of FIG. 1.

A mounting material 212, such as a die-attach adhesive, may attach the first integrated circuit 210 and the substrate 102, with a first side 214, such as an inactive side, of the first integrated circuit 210 over the mounting material 212. The first integrated circuit 210 may include first interconnect contacts 216, such as bonding pads, over a second side 218, such as an active side, of the first integrated circuit 210. The second side 218 of the first integrated circuit 210 is defined as the second side 218 of the first integrated circuit 210 over the first side 214 of the first integrated circuit 210.

The integrated circuit packaging system 100 may include the interconnects 220, such as bond wires, which may connect the substrate 102 along the first side 214 of the first integrated circuit 210 and the first interconnect contacts 216 of the first integrated circuit 210 over the first side 214 and the second side 218 of the first integrated circuit 210. The interface layer 222, such as a dielectric, a cut and place film, a thermal adhesive, or a thermally conductive gel, may be over the first integrated circuit 210. The interconnects 220 may connect only along the opposite sides 118 of FIG. 1 of the first integrated circuit 210.

The integrated circuit packaging system 100 may include a heat spreader 224, such as solid or perforated, over the interface layer 222. The heat spreader 224 may include a planar horizontal portion 226 and a vertical support 228.

The planar horizontal portion 226 of the heat spreader 224 may include the openings 114. The integrated circuit packaging system 100 may include perforating the planar horizontal portion 226 of the heat spreader 224 with a regular pattern of the openings 114. The planar horizontal portion 226 of the heat spreader 224 may include an overhang portion 230 over the second side 218 of the first integrated circuit 210.

The vertical support 228 of the heat spreader 224 may be over and thermally coupled to the through thermal channel 202. A thermal adhesive 232, such as thermal epoxy, thermal gel, or epoxy dot, may attach between the vertical support 228 of the heat spreader 224 and the through thermal channel 202. It is understood that two elements are thermally coupled if they are in physical contact or joined by a thermally conductive medium, including the thermal adhesive 232.

The vertical support 228 of the heat spreader 224 may attach at right angles to the opposite sides 118 of FIG. 1 of the first integrated circuit 210 to the through thermal channel 202 of the substrate 102. The integrated circuit packaging system 100 may include a gap 242 between the vertical support 228 of the heat spreader 224 and the first integrated circuit 210. The integrated circuit packaging system 100 may include the vertical supports 228 of the heat spreader 224 in line with sides 244 of the heat spreader 224.

The heat spreader 224 may have the length 122 of FIG. 1 longer than the width 120 of FIG. 1. The width 120 of FIG. 1 of the heat spreader 224 may be smaller than the width 124 of FIG. 1 of the first integrated circuit 210. The heat spreader 224 may extend over the first integrated circuit 210 and between the opposite sides 118 of FIG. 1 of the first integrated circuit 210.

An aspect of the present invention is that the integrated circuit packaging system 100 may not include the interface layer 222. In a case when the first integrated circuit 210 is fully passivated, the integrated circuit packaging system 100 may include the heat spreader 224 on the first integrated circuit 210. In a case when the first integrated circuit 210 is not fully passivated, the integrated circuit packaging system 100 may include the interface layer 222 in between the first integrated circuit 210 and the heat spreader 224 to provide an electrical isolation and thus prevent electrical short between the first integrated circuit 210 and the heat spreader 224.

It has been discovered that manufacturability may be improved by forming the gap 242 between the vertical support 228 of the heat spreader 224 and the first integrated circuit 210. For example, the gap 242 provides a tolerance during a placement of the heat spreader 224 and thus may prevent damage to the first integrated circuit 210 during the manufacture process. As another example, the gap 242 provides a better encapsulation process to improve mold flow around the heat spreader 224 and the first integrated circuit 210.

The integrated circuit packaging system 100 may include the second integrated circuit 106 over the heat spreader 224. A spacer 234, such as a paste, a wire in film (WIF), a thermal adhesive, or a silicon spacer, may attach between the second integrated circuit 106 and the heat spreader 224.

The spacer 234 may be formed in the openings 114 of the heat spreader 224. The spacer 234 may provide an electrical isolation between the second integrated circuit 106 and the heat spreader 224, with a first side 236, such as an inactive side, of the second integrated circuit 106 over the spacer 234.

The second integrated circuit 106 may include the top interconnect contacts 108 over a second side 238, such as an active side, of the second integrated circuit 106. The second side 238 of the second integrated circuit 106 is defined as the second side 238 of the second integrated circuit 106 over the first side 236 of the second integrated circuit 106.

The integrated circuit packaging system 100 may include the interconnects 116, which may connect the substrate 102 along the first side 236 of the second integrated circuit 106 and the top interconnect contacts 108 of the second integrated circuit 106 over the first side 236 and the second side 238 of the second integrated circuit 106. The interface layer 110 may be over the second integrated circuit 106.

The integrated circuit packaging system 100 may include mounting the additional heat spreader 112 over the interface layer 110. The additional heat spreader 112 may be identical to the heat spreader 224. The additional heat spreader 112 may include the planar horizontal portion 226 and the vertical support 228.

The planar horizontal portion 226 may include the openings 114. The planar horizontal portion 226 of the additional heat spreader 112 may include the overhang portion 230 over the second side 238 of the second integrated circuit 106.

The vertical support 228 of the additional heat spreader 112 may be over and thermally coupled to the vertical support 228 of the heat spreader 224. The thermal adhesive 232 may attach between the vertical support 228 of the additional heat spreader 112 and the vertical support 228 of the heat spreader 224.

The integrated circuit packaging system 100 may include the encapsulant 240, such as a cover including epoxy molding compound, having a flat top, formed around and including on surfaces of the substrate 102, the first integrated circuit 210, the heat spreader 224, the second integrated circuit 106, and the additional heat spreader 112.

It has been discovered that the integrated circuit packaging system 100 including the heat spreader 224 and the additional heat spreader 112 acts as a heat exchanger providing an efficient method of transferring a larger amount of heat from a stacked configuration of the first integrated circuit 210 and the second integrated circuit 106 to the substrate 102. The heat generated from the first side 236 of the second integrated circuit 106 is spread out to the heat spreader 224 and the heat generated from the second side 238 of the second integrated circuit 106 is spread out to the additional heat spreader 112. The vertical supports 228 of the heat spreader 224 and the additional heat spreader 112 are thermally coupled to the through thermal channels 202 of the substrate 102 thereby significantly increase the reliability and thus extend the life of the integrated circuits in the package.

It has also been discovered that the integrated circuit packaging system 100 allows a stacked configuration of the same heat spreaders 224 and 112 because the heat spreaders 224 and 112 can be identical thereby reducing the design cost and the manufacturing cost.

It has further been discovered that the vertical supports 228 of the heat spreader 224 and the additional heat spreader 112 are thermally coupled to the same through thermal channel 202 in a vertical configuration thereby increasing the substrate design routability and thus further reducing the manufacturing cost.

Figure 3:
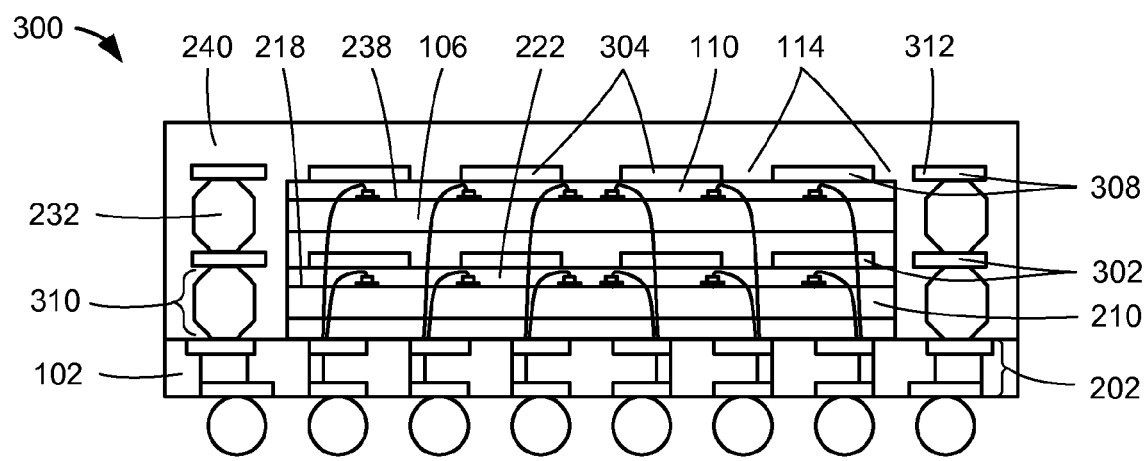
FIG. 3 is a cross-sectional view similar to FIG. 2 of an integrated circuit packaging system, in a second embodiment of the present invention.

Referring now to FIG. 3, therein is shown a cross-sectional view similar to FIG. 2 of an integrated circuit packaging system 300, in a second embodiment of the present invention. The cross-sectional view similar to FIG. 2 of the integrated circuit packaging system 300 depicts a heat spreader 302, such as solid or perforated, over the interface layer 222. The heat spreader 302 may include a planar horizontal portion 304.

The planar horizontal portion 304 of the heat spreader 302 may include the openings 114. The integrated circuit packaging system 300 may include perforating the planar horizontal portion 304 of the heat spreader 302 with a regular pattern of the openings 114. The planar horizontal portion 304 of the heat spreader 302 may include an overhang portion 312 over the second side 218 of the first integrated circuit 210.

The heat spreader 302 may be over and thermally coupled to the through thermal channel 202. The thermal adhesive 232 may attach between the heat spreader 302 and the through thermal channel 202. It is understood that two elements are thermally coupled if they are in physical contact or joined by a thermally conductive medium, including the thermal adhesive 232.

The thermal adhesive 232 may also act as a vertical support 310. The heat spreader 302 may extend over the first integrated circuit 210 and between the opposite sides 118 of FIG. 1 of the first integrated circuit 210. The thermal adhesive 232, which may act as the vertical support 310 of the heat spreader 302, may attach at right angles to the opposite sides 118 of FIG. 1 of the first integrated circuit 210 to the through thermal channel 202 of the substrate 102.

It has been discovered that the heat spreader 302 is simpler compared to the heat spreader 224 of FIG. 2 and thus may provide a lower manufacturing cost.

The integrated circuit packaging system 300 may include an additional heat spreader 308, such as solid or perforated, over the interface layer 110. The additional heat spreader 308 may be identical to the heat spreader 302. The additional heat spreader 308 may include the planar horizontal portion 304.

The planar horizontal portion 304 may include the openings 114. The planar horizontal portion 304 of the additional heat spreader 308 may include the overhang portion 312 over the second side 238 of the second integrated circuit 106.

The additional heat spreader 308 may be over and thermally coupled to the heat spreader 302. The thermal adhesive 232, also as the vertical support 310, may attach between the additional heat spreader 308 and the heat spreader 302.

The integrated circuit packaging system 300 may include the encapsulant 240, having a flat top, formed around and including on surfaces of the substrate 102, the first integrated circuit 210, the heat spreader 302, the second integrated circuit 106, and the additional heat spreader 308.

Figure 4:
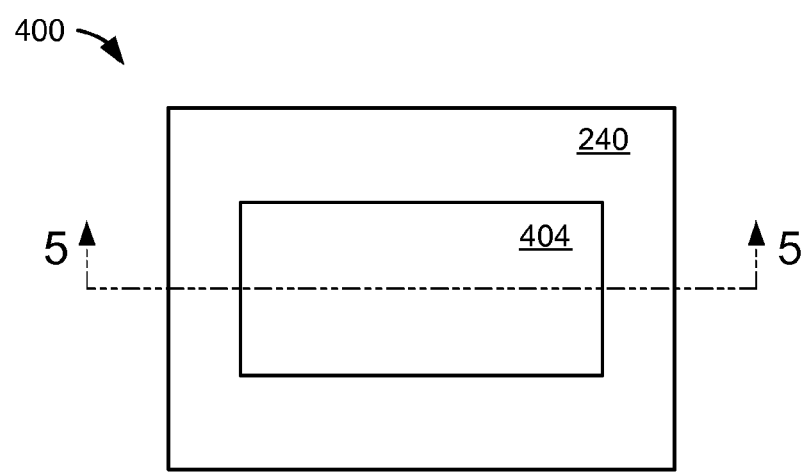
FIG. 4 is a top view similar to FIG. 1 of an integrated circuit packaging system in a third embodiment of the present invention.

Referring now to FIG. 4, therein is shown a top view similar to FIG. 1 of an integrated circuit packaging system 400 in a third embodiment of the present invention. The top view depicts the encapsulant 240 having an exposed side 404 of a further heat spreader (not shown).

Figure 5:
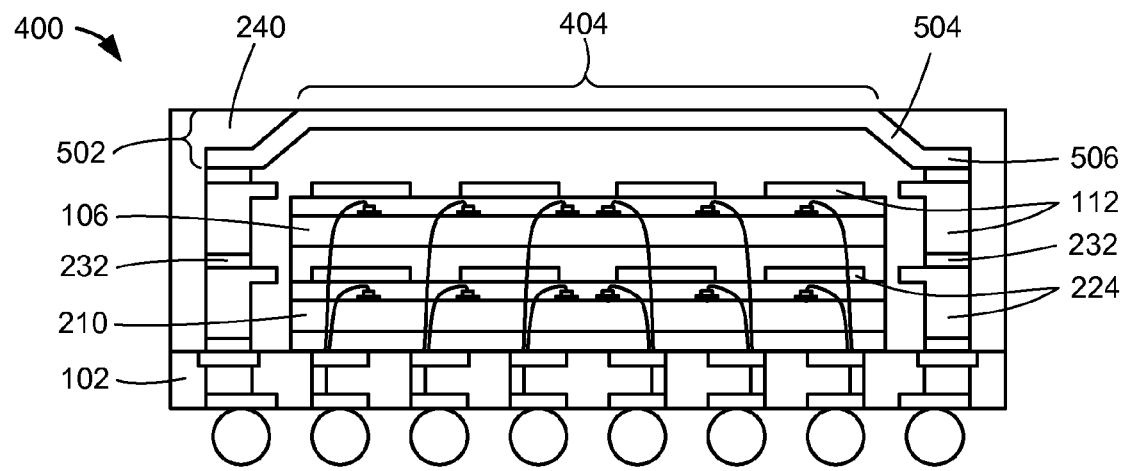
FIG. 5 is a cross-sectional view of the integrated circuit packaging system along a section line 5-5 of FIG. 4.

Referring now to FIG. 5, therein is shown a cross-sectional view of the integrated circuit packaging system 400 along a section line 5-5 of FIG. 4. The integrated circuit packaging system 400 may include a further heat spreader 502 having the exposed side 404, a sloped segment 504, and a flange segment 506.

The flange segment 506 may be over or on the additional heat spreader 112. The thermal adhesive 232 may attach between the flange segment 506 and the additional heat spreader 112. The additional heat spreader 112 may be over and thermally coupled to the heat spreader 224. The thermal adhesive 232 may attach between the additional heat spreader 112 and the heat spreader 224.

The integrated circuit packaging system 400 may include the exposed side 404 of the further heat spreader 502 exposed from the encapsulant 240. The exposed side 404 of the further heat spreader 502 may be co-planar with the encapsulant 240.

The integrated circuit packaging system 400 may include the encapsulant 240, having a flat top, formed around and including on surfaces of the substrate 102, the first integrated circuit 210, the heat spreader 224, the second integrated circuit 106, the additional heat spreader 112, and the further heat spreader 502.

Figure 6:
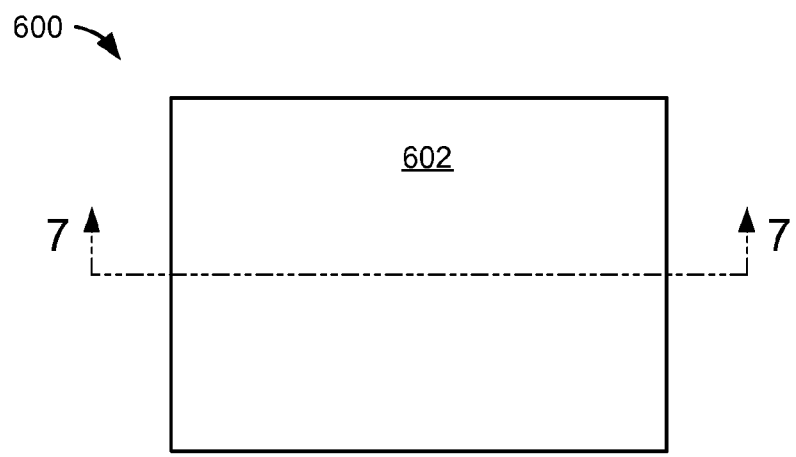
FIG. 6 is a top view similar to FIG. 1 of an integrated circuit packaging system in a fourth embodiment of the present invention.

Referring now to FIG. 6, therein is shown a top view similar to FIG. 1 of an integrated circuit packaging system 600 in a fourth embodiment of the present invention. The top view depicts a further heat spreader 602.

Figure 7:
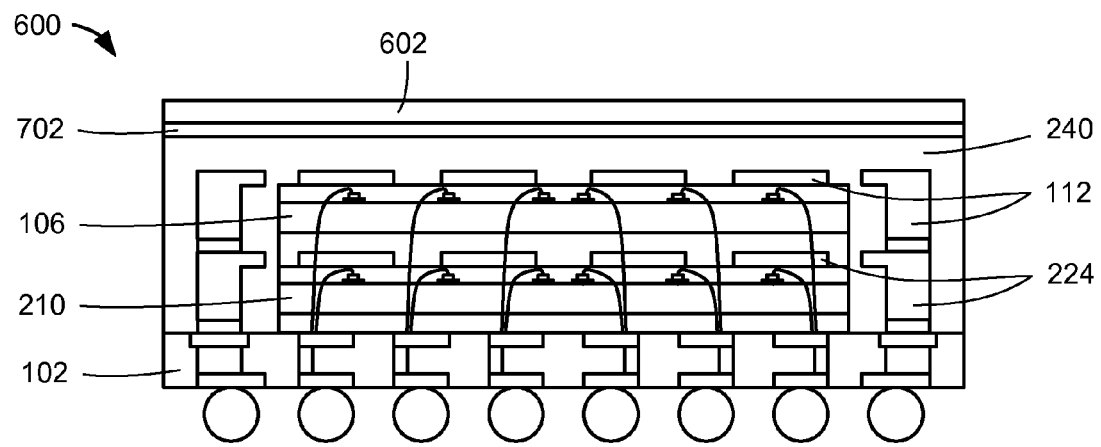
FIG. 7 is a cross-sectional view of the integrated circuit packaging system along a section line 7-7 of FIG. 6.

Referring now to FIG. 7, therein is shown a cross-sectional view of the integrated circuit packaging system 600 along a section line 7-7 of FIG. 6. The further heat spreader 602 may be over the encapsulant 240.

The thermal adhesive 702, such as a thermal epoxy or thermal gel, may attach between the further heat spreader 602 and the encapsulant 240. It is understood that two elements are thermally coupled if they are in physical contact or joined by a thermally conductive medium, including the thermal adhesive 702.

The integrated circuit packaging system 600 may provide the encapsulant 240, having a flat top, formed around and including on surfaces of the substrate 102, the first integrated circuit 210, the heat spreader 224, the second integrated circuit 106, and the additional heat spreader 112.

Figure 8:
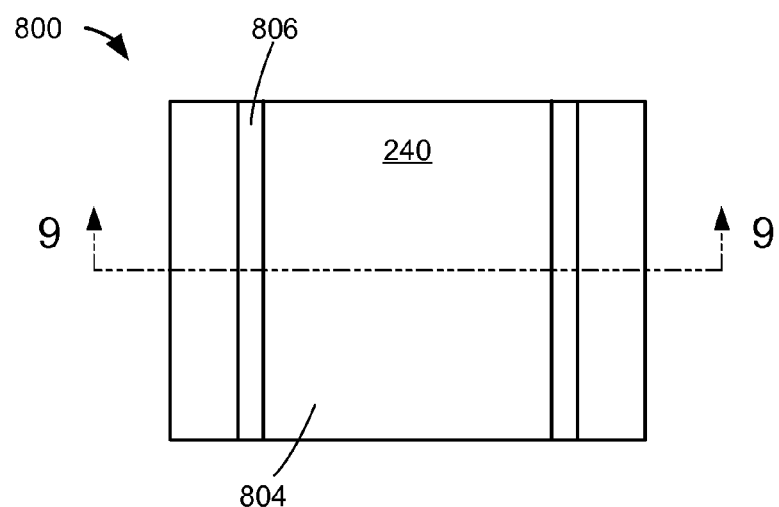
FIG. 8 is a top view similar to FIG. 1 of an integrated circuit packaging system in a fifth embodiment of the present invention.

Referring now to FIG. 8, therein is shown a top view similar to FIG. 1 of an integrated circuit packaging system 800 in a fifth embodiment of the present invention. The top view depicts the encapsulant 240, such as a cover including epoxy molding compound, having a recess 804. The recess 804 may contain sloped walls 806.

Figure 9:
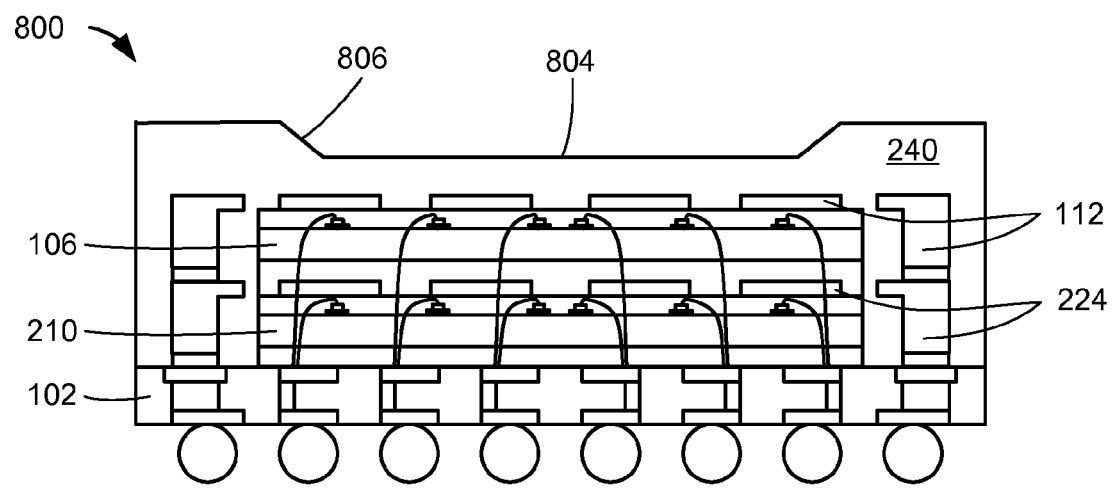
FIG. 9 is a cross-sectional view of the integrated circuit packaging system along a section line 9-9 of FIG. 8.

Referring now to FIG. 9, therein is shown a cross-sectional view of the integrated circuit packaging system 800 along a section line 9-9 of FIG. 8. The integrated circuit packaging system 800 may include the encapsulant 240 with the recess 804 having the sloped walls 806. The integrated circuit packaging system 800 may provide the encapsulant 240 formed around and including on surfaces of the substrate 102, the first integrated circuit 210, the heat spreader 224, the second integrated circuit 106, and the additional heat spreader 112.

Figure 10:
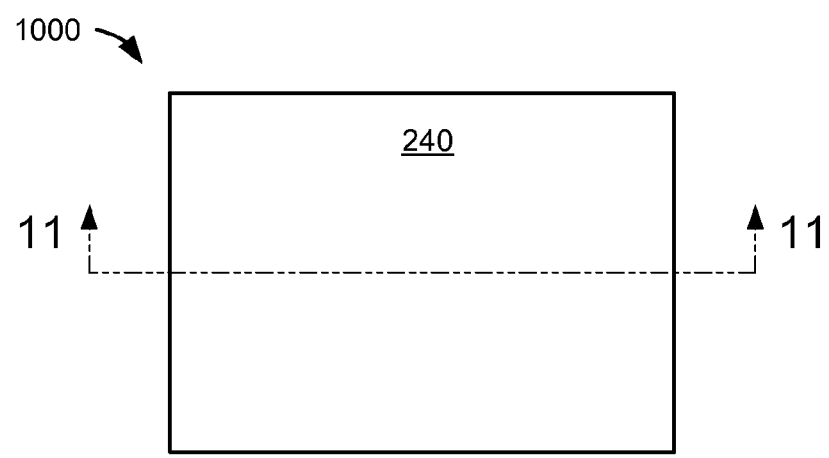
FIG. 10 is a top view similar to FIG. 1 of an integrated circuit packaging system in a sixth embodiment of the present invention.

Referring now to FIG. 10, therein is shown a top view similar to FIG. 1 of an integrated circuit packaging system 1000 in a sixth embodiment of the present invention. The top view depicts the encapsulant 240.

Figure 11:
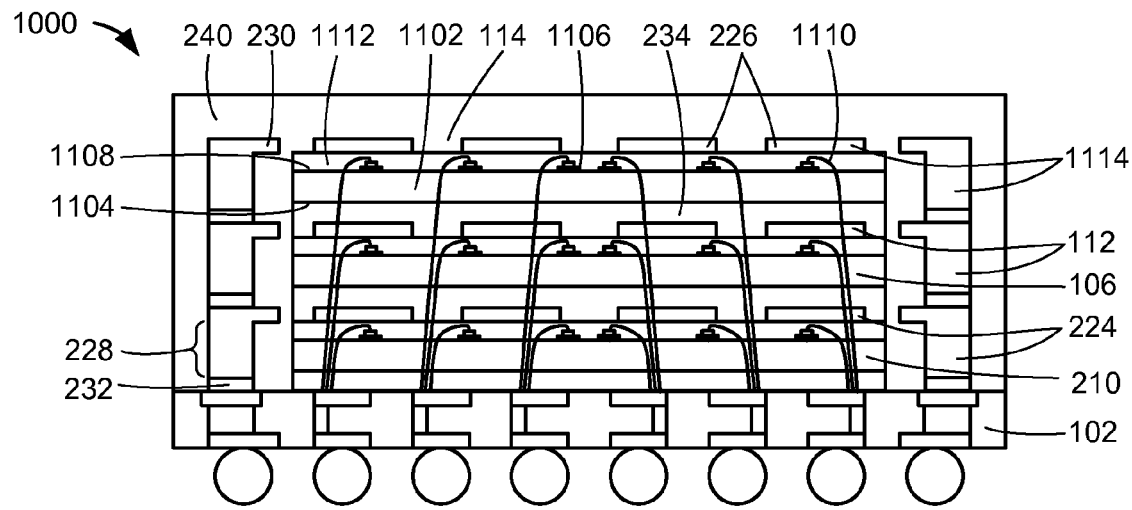
FIG. 11 is a cross-sectional view of the integrated circuit packaging system along a section line 11-11 of FIG. 10.

Referring now to FIG. 11, therein is shown a cross-sectional view of the integrated circuit packaging system 1000 along a section line 11-11 of FIG. 10. The integrated circuit packaging system 1000 may include a third integrated circuit 1102 over the additional heat spreader 112 with the spacer 234 in between.

The spacer 234 may be formed in the openings 114 of the additional heat spreader 112. The spacer 234 may provide an electrical isolation between the third integrated circuit 1102 and the additional heat spreader 112, with a first side 1104 of the third integrated circuit 1102 over the spacer 234.

The third integrated circuit 1102 may include third interconnect contacts 1106 over a second side 1108 of the third integrated circuit 1102. The second side 1108 of the third integrated circuit 1102 is defined as the second side 1108 of the third integrated circuit 1102 over the first side 1104 of the third integrated circuit 1102.

The integrated circuit packaging system 1000 may include the interconnects 1110, which may connect the substrate 102 along the first side 1104 of the third integrated circuit 1102 and the third interconnect contacts 1106 of the third integrated circuit 1102 over the first side 1104 and the second side 1108 of the third integrated circuit 1102. The interconnects 1110 may connect only along the opposite sides 118 of FIG. 1 of the third integrated circuit 1102. The interface layer 1112 may be over the third integrated circuit 1102.

The integrated circuit packaging system 1000 may include a second additional heat spreader 1114, such as solid or perforated, over the interface layer 1112. The second additional heat spreader 1114 may be identical to the heat spreader 224. The second additional heat spreader 1114 may include the planar horizontal portion 226 and the vertical support 228.

The planar horizontal portion 226 may include the openings 114. The planar horizontal portion 226 of the second additional heat spreader 1114 may include the overhang portion 230 over the second side 1108 of the third integrated circuit 1102.

The vertical support 228 of the second additional heat spreader 1114 may be over and thermally coupled to the vertical support 228 of the additional heat spreader 112. The thermal adhesive 232 may attach between the vertical support 228 of the second additional heat spreader 1114 and the vertical support 228 of the additional heat spreader 112.

The integrated circuit packaging system 1000 may provide the encapsulant 240, having a flat top, formed around and including on surfaces of the substrate 102, the first integrated circuit 210, the heat spreader 224, the second integrated circuit 106, the additional heat spreader 112, the third integrated circuit 1102, and the second additional heat spreader 1114.

Figure 12:
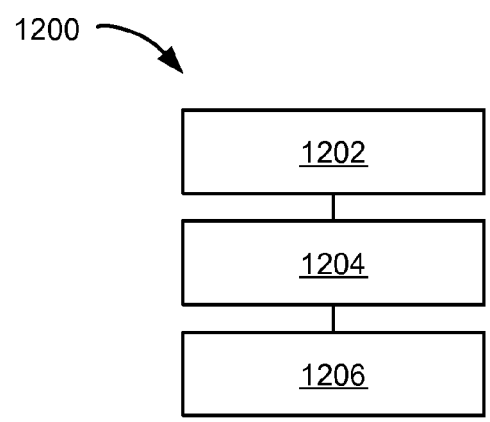
FIG. 12 is a flow chart of a method of manufacture of an integrated circuit packaging system in a further embodiment of the present invention.

Referring now to FIG. 12, therein is shown a flow chart of a method of manufacture of an integrated circuit packaging system in a further embodiment of the present invention. The method includes: providing a substrate in a block 1202; attaching a first integrated circuit to the substrate by interconnects only along opposite sides of the first integrated circuit in a block 1204; and attaching a heat spreader to the substrate, the heat spreader extending over the first integrated circuit and between the opposite sides of the first integrated circuit in a block 1206.

An aspect of the present invention is that the design of the heat spreader 224 of FIG. 2 or 302 of FIG. 3 may include either the vertical support 228 of FIG. 2 or 310 of FIG. 3 or the planar horizontal portion 226 of FIG. 2 or 304 of FIG. 3 of the heat spreaders 224 of FIG. 2 or 302 of FIG. 3 over the thermal adhesive 232 of FIG. 2 or FIG. 3. Either the vertical support 228 of FIG. 2 or 310 of FIG. 3 or the planar horizontal portion 226 of FIG. 2 or 304 of FIG. 3 of the heat spreaders 224 of FIG. 2 or 302 of FIG. 3 may be used equivalently as required by the structure of the package.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   attaching a first integrated circuit to the substrate by interconnects only along opposite sides of the first integrated circuit; attaching an interface layer over the first integrated circuit;
   attaching a heat spreader to the substrate, the heat spreader extending over the first integrated circuit; and
   wherein portions of the substrate and portions of the interface layer visible through openings of a regular pattern in the heat spreader and between the opposite sides of an first integrated circuit.

2. The method as claimed in claim 1 further comprising positioning the interface layer between a first integrated circuit and the heat spreader.

3. The method as claimed in claim 1 wherein attaching the heat spreader includes perforating a regular pattern of openings in the heat spreader for adjusting the coefficient of thermal expansion of the heat spreader for the coefficient of thermal expansion of the substrate.

4. The method as claimed in claim 1 wherein attaching the heat spreader includes providing vertical supports therefor in line with sides of the heat spreader.

5. The method as claimed in claim 1 further comprising attaching a further heat spreader over the heat spreader.

6. A method of manufacture of an integrated circuit packaging system comprising:
   providing a substrate;
   attaching a first integrated circuit to the substrate by interconnects only along opposite sides of the first integrated circuit;
   attaching an interface layer over the first integrated circuit;
   attaching a heat spreader to the substrate, the heat spreader extending over the first integrated circuit between the opposite sides of the first integrated circuit;
   attaching a second integrated circuit over the heat spreader by interconnects only along opposite sides of the second integrated circuit; and
   attaching an additional heat spreader to the heat spreader, the additional heat spreader identical to the heat spreader and extending over the second integrated circuit between the opposite sides of the second integrated circuit; and
   wherein portions of the substrate and portions of the interface layer visible through openings of a regular pattern in the heat spreader.

7. The method as claimed in claim 6 further comprising:
   positioning interface layers between the first integrated circuit and the heat spreader and between the second integrated circuit and the additional heat spreader; and
   positioning a spacer between the heat spreader and the second integrated circuit.

8. The method as claimed in claim 6 wherein attaching the heat spreader includes perforating the regular pattern of openings in the heat spreader for adjusting the coefficient of thermal expansion of the heat spreader for the coefficients of thermal expansion of the substrate and the second integrated circuit.

9. The method as claimed in claim 6 further comprising providing an encapsulant, having a flat top or a recess in the top, around the first integrated circuit and the heat spreader.

10. The method as claimed in claim 6 further comprising attaching a further heat spreader over or on the additional heat spreader.

11. An integrated circuit packaging system comprising:
    a substrate;
    a first integrated circuit attached to the substrate by interconnects only along opposite sides of the first integrated circuit; an interface layer over the first integrated circuit;
    a heat spreader attached to the substrate, the heat spreader extending over the first integrated circuit; and wherein portions of the substrate and portions of the interface layer visible through openings of a regular pattern in the heat spreader and between the opposite sides of the first integrated circuit.

12. The system as claimed in claim 11 wherein the comprising an interface layer is between the first integrated circuit and the heat spreader.

13. The system as claimed in claim 11 further comprising a regular pattern of openings in the heat spreader has the coefficient of thermal expansion of the heat spreader matched to the coefficient of thermal expansion of the substrate by the regular pattern of openings.

14. The system as claimed in claim 11 further comprising vertical supports therefor in line with sides of the heat spreader.

15. The system as claimed in claim 11 further comprising a further heat spreader over the heat spreader.

16. The system as claimed in claim 11 further comprising:
a second integrated circuit over the heat spreader by interconnects only along opposite sides of the second integrated circuit; and
an additional heat spreader attached to the heat spreader, the additional heat spreader identical to the heat spreader and extending over the second integrated circuit between the opposite sides of the second integrated circuit.

17. The system as claimed in claim 16 further comprising:
interface layers between the first integrated circuit and the heat spreader and between the second integrated circuit and the additional heat spreader; and
a spacer between the heat spreader and the second integrated circuit.

18. The system as claimed in claim 16 further comprising a regular pattern of openings in additional the heat spreader with the coefficient of thermal expansion of the heat spreader matched to the coefficients of thermal expansion of the substrate and the second integrated circuit by the regular pattern of openings.

19. The system as claimed in claim 16 further comprising an encapsulant, having a flat top or a recess in the top, around the first integrated circuit and the heat spreader.

20. The system as claimed in claim 16 further comprising a further heat spreader over or on the additional heat spreader.

* * * * *

UNITED STATES PATENT AND TRADEMARK OFFICE
CERTIFICATE OF CORRECTION

PATENT NO. : 8,039,316 B2
APPLICATION NO. : 12/423099
DATED : October 18, 2011
INVENTOR(S) : Chi et al.

It is certified that error appears in the above-identified patent and that said Letters Patent is hereby corrected as shown below:

Column 2:
line 25, add double dashes between numbers 2-2 as follows: delete "section line 2-2 of FIG. 1." and insert therefor --section line 2--2 of FIG. 1.-- line 33, add double dashes between numbers 5-5 as follows: delete "section line 5-5 of FIG. 4." and insert therefor --section line 5--5 of FIG. 4.-- line 38, add double dashes between numbers 7-7 as follows: delete "section line 7-7 of FIG. 6." and insert therefor --section line 7--7 of FIG. 6.-- line 43, add double dashes between numbers 9-9 as follows: delete "section line 9-9 of FIG. 8." and insert therefor --section line 9--9 of FIG. 8.-- line 48, add double dashes between numbers 11-11 as follows: delete "section line 11-11 of FIG. 10." and insert therefor --section line 11--11 of FIG. 10.--

Column 4:
line 23, add double dashes between numbers 2-2 as follows: delete "section line 2-2 of FIG. 1." and insert therefor --section line 2--2 of FIG. 1.--

Column 7:
line 42, add double dashes between numbers 5-5 as follows: delete "section line 5-5 of FIG. 4." and insert therefor --section line 5--5 of FIG. 4.--

Column 8:
line 3, add double dashes between numbers 7-7 as follows: delete "section line 7-7 of FIG. 6." and insert therefor --section line 7--7 of FIG. 6.--

Signed and Sealed this
Twenty-fifth Day of September, 2012

David J. Kappos
*Director of the United States Patent and Trademark Office*

CERTIFICATE OF CORRECTION (continued)  
U.S. Pat. No. 8,039,316 B2 line 25, add double dashes between numbers 9-9 as follows: delete "section line 9-9 of FIG. 8." and insert therefor --section line 9--9 of FIG. 8.-- line 38, add double dashes between numbers 11-11 as follows: delete "section line 11-11 of FIG. 10." and insert therefor --section line 11--11 of FIG. 10.--

Column 9:
claim 1, lines 64-67, delete:

"attaching a first integrated circuit to the substrate by interconnects only along opposite sides of the first integrated circuit; attaching an interface layer over the first integrated circuit;"

and insert therefor

--attaching a first integrated circuit to the substrate by interconnects only along opposite sides of the first integrated circuit;

attaching an interface layer over the first integrated circuit;¶--

Column 10:
lines 1-6, delete:

"attaching a heat spreader to the substrate, the heat spreader extending over the first integrated circuit; and wherein portions of the substrate and portions of the interface layer visible through openings of a regular pattern in the heat spreader and between the opposite sides of an first integrated circuit."

and insert therefor

--attaching a heat spreader to the substrate, the heat spreader extending over the first integrated circuit and between the opposite sides of the first integrated circuit; and wherein portions of the substrate and portions of the interface layer visible through openings of a regular pattern in the heat spreader.-- claim 2, line 8, delete "layer between a first integrated" and insert therefor --layer between the first integrated-- claim 3, line 11, delete "perforating a regular pattern" and insert therefor --perforating the regular pattern--

CERTIFICATE OF CORRECTION (continued)
U.S. Pat. No. 8,039,316 B2 claim 11, lines 1-4, delete:

"wherein portions of the substrate and portions of the interface layer visible through openings of a regular pattern in the heat spreader and between the opposite sides of the first integrated circuit."

and insert therefor

--wherein portions of the substrate and portions of the interface layer visible through openings of a regular pattern in the heat spreader.-- claim 11, lines 63-65, delete:

"a first integrated circuit attached to the substrate by interconnects only along opposite sides of the first integrated circuit; an interface layer over the first integrated circuit;"

and insert therefor

--a first integrated circuit attached to the substrate by interconnects only along opposite sides of the first integrated circuit;
an interface layer over the first integrated circuit;-- claim 11, lines 66-67, delete:

"a heat spreader attached to the substrate, the heat spreader extending over the first integrated circuit; and"

and insert therefor

--a heat spreader attached to the substrate, the heat spreader extending over the first integrated circuit between the opposite sides of the first integrated circuit; and--

Column 11:
claim 12, lines 5-6, delete "wherein the comprising an interface layer" and insert therefor --wherein the interface layer-- claim 13, lines 8-9, delete "claim 11 further comprising a regular pattern" and insert therefor --claim 11 wherein the regular pattern--

Column 12:
claim 18, line 11, delete "in additional the heat" and insert therefor --in the additional heat--